(12) United States Patent
Yoshimura

(10) Patent No.: US 11,749,503 B2
(45) Date of Patent: Sep. 5, 2023

(54) PROCESSING METHOD AND PLASMA PROCESSING APPARATUS

(71) Applicant: Tokyo Electron Limited, Tokyo (JP)

(72) Inventor: Takuto Yoshimura, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 223 days.

(21) Appl. No.: 17/151,839

(22) Filed: Jan. 19, 2021

(65) Prior Publication Data

US 2021/0233743 A1    Jul. 29, 2021

(30) Foreign Application Priority Data

Jan. 27, 2020    (JP) .............................. JP2020-010847

(51) Int. Cl.
    *H01J 37/32*    (2006.01)
(52) U.S. Cl.
    CPC .. *H01J 37/32174* (2013.01); *H01J 37/32146* (2013.01); *H01J 37/32568* (2013.01); *H01J 37/32715* (2013.01)
(58) Field of Classification Search
    None
    See application file for complete search history.

(56) References Cited

U.S. PATENT DOCUMENTS

2009/0294062 A1\* 12/2009 Shannon ........... H01J 37/32091
                                                    156/345.24
2017/0103873 A1\*  4/2017 Kawasaki ......... H01J 37/32183

FOREIGN PATENT DOCUMENTS

JP         2016-157735        9/2016

OTHER PUBLICATIONS

Translation of WO 2019244734 A (Year: 2019).\*

\* cited by examiner

*Primary Examiner* — Shamim Ahmed
(74) *Attorney, Agent, or Firm* — IPUSA, PLLC

(57) ABSTRACT

A method performed by a plasma processing apparatus including a first electrode and a second electrode is provided. The method includes applying a pulsed wave of first radio frequency (RF) power to the first electrode or the second electrode; and applying a pulsed wave of second RF power having a lower frequency than the first RF power, to the first electrode with a given phase difference relative to the pulsed wave of the first RF power. A first on-period of the second RF power and a second on-period of the second RF power are controlled such that the first on-period and the second on-period do not overlap with a period of time while the first RF power is turned on. Also, the first on-period is controlled such that the first on-period ends just before the first RF power is turned on.

5 Claims, 6 Drawing Sheets

FIG.3 RELATED ART

| RF | | (a) COMPARATIVE EXAMPLE 1 | (b) COMPARATIVE EXAMPLE 2 |
|---|---|---|---|
| HF | Freq. | X kHz | X kHz |
| | Duty | Y % | Y % |
| LF | Freq. | X kHz | X kHz |
| | Duty | Y % | Z % |
| | Offset | — | A % |
| APPLICATION TIMING | | HF, LF pulses aligned; period 1/X ms; both Duty Y% | HF, LF pulses with LF Duty Z% and Offset A% |

PROCESSING METHOD AND PLASMA PROCESSING APPARATUS

CROSS-REFERENCE TO RELATED APPLICATIONS

This patent application is based upon and claims priority to Japanese Patent Application No. 2020-010847 filed on Jan. 27, 2020, the entire contents of which are incorporated herein by reference.

TECHNICAL FIELD

The present disclosure relates to a processing method and a plasma processing apparatus.

BACKGROUND

Patent Document 1 describes a plasma processing method in which a substrate on a mounting table is subjected to a plasma process. In the plasma processing method described in Patent Document 1, a pulse wave of radio frequency power for generating a plasma and a pulse wave of radio frequency power for biasing, the radio frequency power for biasing having a lower frequency than the radio frequency power for plasma generation are applied to the mounting table. Patent Document 1 proposes controlling the pulse wave of radio frequency power for plasma generation and the pulse wave of radio frequency power for biasing, such that a predetermined phase difference occurs between the pulse wave of radio frequency power for plasma generation and the pulse wave of radio frequency power for biasing, and that a duty cycle of the pulse wave of radio frequency power for plasma generation is greater than a duty cycle of the pulse wave of radio frequency power for biasing.

RELATED ART DOCUMENT

Patent Document

[Patent Document 1] Japanese Laid-open Patent Application Publication No. 2016-157735

SUMMARY

The present disclosure provides a technique that can apply radio frequency (RF) pulsed power while maintaining plasma density.

According to one aspect of the present disclosure, a method performed by a plasma processing apparatus including a first electrode and a second electrode is provided. The method includes applying a pulsed wave of a first radio frequency (RF) power to the first electrode or the second electrode; and applying a pulsed wave of a second RF power having a lower frequency than the first RF power, to the first electrode with a given phase difference relative to the pulsed wave of the first RF power. A first on-period of the second RF power, during which the second RF power is turned on, and a second on-period of the second RF power different from the first on-period, during which the second RF power is turned on, are controlled such that the first on-period and the second on-period do not overlap with a period of time while the first RF power is turned on. Also, the first on-period is controlled such that the first on-period ends just before the first RF power is turned on.

BRIEF DESCRIPTION OF THE DRAWINGS

FIG. 3 is a diagram illustrating an example of application of RF pulses according to comparative examples;

DETAILED DESCRIPTION OF EMBODIMENTS

Hereinafter, embodiments for carrying out the present disclosure will be described with reference to the drawings. With respect to the drawings, elements having substantially identical features are given the same reference symbols, and overlapping descriptions may be omitted.

[Plasma Processing System]

Figure 1:
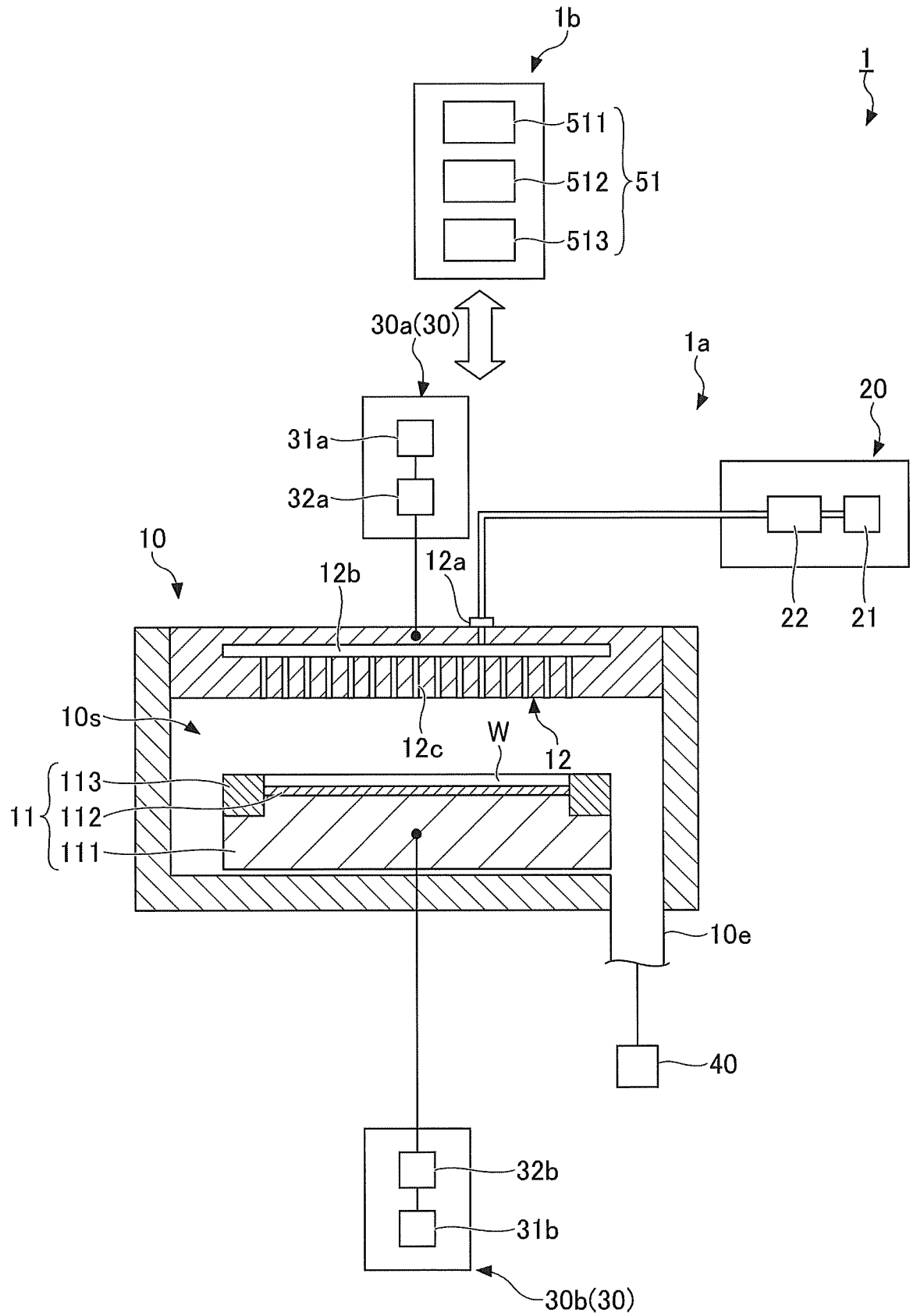
FIG. 1 is a cross-sectional diagram illustrating an example of a plasma processing apparatus according to an embodiment.

A plasma processing system 1 according to an embodiment will be described with reference to FIG. 1. FIG. 1 is a cross-sectional diagram illustrating an example of a plasma processing system 1 according to an embodiment. In the present embodiment, the plasma processing system 1 includes a plasma processing apparatus 1a and a controller 1b. The plasma processing apparatus 1a includes a chamber 10, a gas supply section 20, a radio frequency (RF) power supply section 30, and an exhaust system 40. The plasma processing apparatus 1a also includes a support 11 and an upper electrode showerhead 12. The support 11 is disposed in a lower region of a plasma processing space 10s in the chamber 10. The upper electrode showerhead 12 is disposed above the support 11 and, may function as part of a ceiling of the chamber 10.

The support 11 is configured to support a substrate W in the plasma processing space 10s. In the present embodiment, the support 11 includes a lower electrode 111, an electrostatic chuck 112, and an edge ring 113. The electrostatic chuck 112 is disposed on the lower electrode 111, and is configured to support a substrate W at the upper surface of the electrostatic chuck 112. The edge ring 113 is disposed to surround the substrate W on the upper surface of the peripheral edge of the lower electrode 111. Also, although not illustrated, in the present embodiment, the support 11 may include a temperature control module configured to adjust the temperature of at least one of the electrostatic chuck 112 and the substrate W to a target temperature. The temperature control module may include a heater, a flow path, or a combination thereof. A temperature control fluid, such as a refrigerant or a heat transfer gas, flows through the flow passage.

The upper electrode showerhead 12 is configured to supply, to the plasma processing space 10s, one or more process gases supplied from the gas supply section 20. In the present embodiment, the upper electrode showerhead 12 includes a gas inlet 12a, a gas diffusion chamber 12b, and multiple gas outlets 12c. The gas inlet 12a is in fluid communication with the gas supply section 20 and the gas diffusion chamber 12b. The multiple gas outlets 12c are in fluid communication with the gas diffusion chamber 12b and the plasma processing space 10s. In the present embodiment, the upper electrode showerhead 12 is configured to supply one or more process gases from the gas inlet 12a to the plasma processing space 10s through the gas diffusion chamber 12b and the multiple gas outlets 12c.

The gas supply section 20 may include one or more gas sources 21 and one or more flow controllers 22. In the present embodiment, the gas supply section 20 is configured to supply one or more process gases from the respective gas sources 21 to the gas inlet 12a via the respective flow controllers 22. Each of the flow controllers 22 may include, for example, a mass flow controller or a pressure-controlled flow controller. In addition, the gas supply section 20 may include one or more flow modulating devices that modulate or pulsate flows of the one or more process gases.

The RF power supply section 30 is configured to supply RF power to an electrode, such as the lower electrode 111 or the upper electrode showerhead 12. Alternatively, the RF power supply section 30 may include multiple RF sources and may be configured to supply RF power to multiple electrodes, such as a combination of the lower electrode 111 and the upper electrode showerhead 12. This generates a plasma from one or more process gases supplied to the plasma processing space 10s. Accordingly, the RF power supply section 30 may function as at least part of a plasma generator configured to generate a plasma from one or more process gases in the chamber. In the present embodiment, the RF power supply section 30 includes a first RF source 30a and a second RF source 30b.

The first RF source 30a includes a first RF generator 31a and a first matching circuit 32a. In the present embodiment, the first RF source 30a is configured to supply first RF power (hereinafter, also referred to as "HF power") from the first RF generator 31a to the upper electrode showerhead 12, through the first matching circuit 32a. For example, the first RF power may have a frequency in the range of 27 MHz to 100 MHz.

The second RF source 30b includes a second RF generator 31b and a second matching circuit 32b. In the present embodiment, the second RF source 30b is configured to supply second RF power (hereinafter, also referred to as "LF power") from the second RF generator 31b to the lower electrode 111 via the second matching circuit 32b. For example, the second RF power has a frequency lower than the frequency of the first RF power, and may have a frequency in the range of 400 kHz to 13.56 MHz.

The RF power supply section 30 may be configured to supply first RF power from an RF generator to the lower electrode 111 and supply second RF power from another RF generator to the lower electrode 111. In addition, in other alternative embodiments, DC voltage may be applied to the upper electrode showerhead 12.

The exhaust system 40 may be connected to, for example, an exhaust port 10e provided at the bottom of the chamber 10. The exhaust system 40 may include a pressure relief valve and a vacuum pump. The vacuum pump may include a turbomolecular pump, a roughing pump, or a combination thereof.

In the present embodiment, the controller 1b processes computer-executable instructions that cause the plasma processing apparatus 1a to execute various steps described in the present disclosure. The controller 1b may be configured to control each element of the plasma processing apparatus 1a to perform the various steps described herein. In one embodiment, part or all of the controller 1b may be included in the plasma processing apparatus 1a. The controller 1b may include, for example, a computer 51. The computer 51 may include, for example, a processor (i.e., central processing unit (CPU)) 511, a storage device 512, and a communication interface 513. The processor 511 may be configured to perform various control operations based on a computer program stored in the storage device 512. The storage device 512 may include a RAM (Random Access Memory), a ROM (Read Only Memory), a hard disk drive (HDD), a solid state drive (SSD), or combinations thereof. The communication interface 513 may communicate with the plasma processing apparatus 1a via a communication line such as a local area network (LAN).

[Pulsed Wave]

Figure 2:
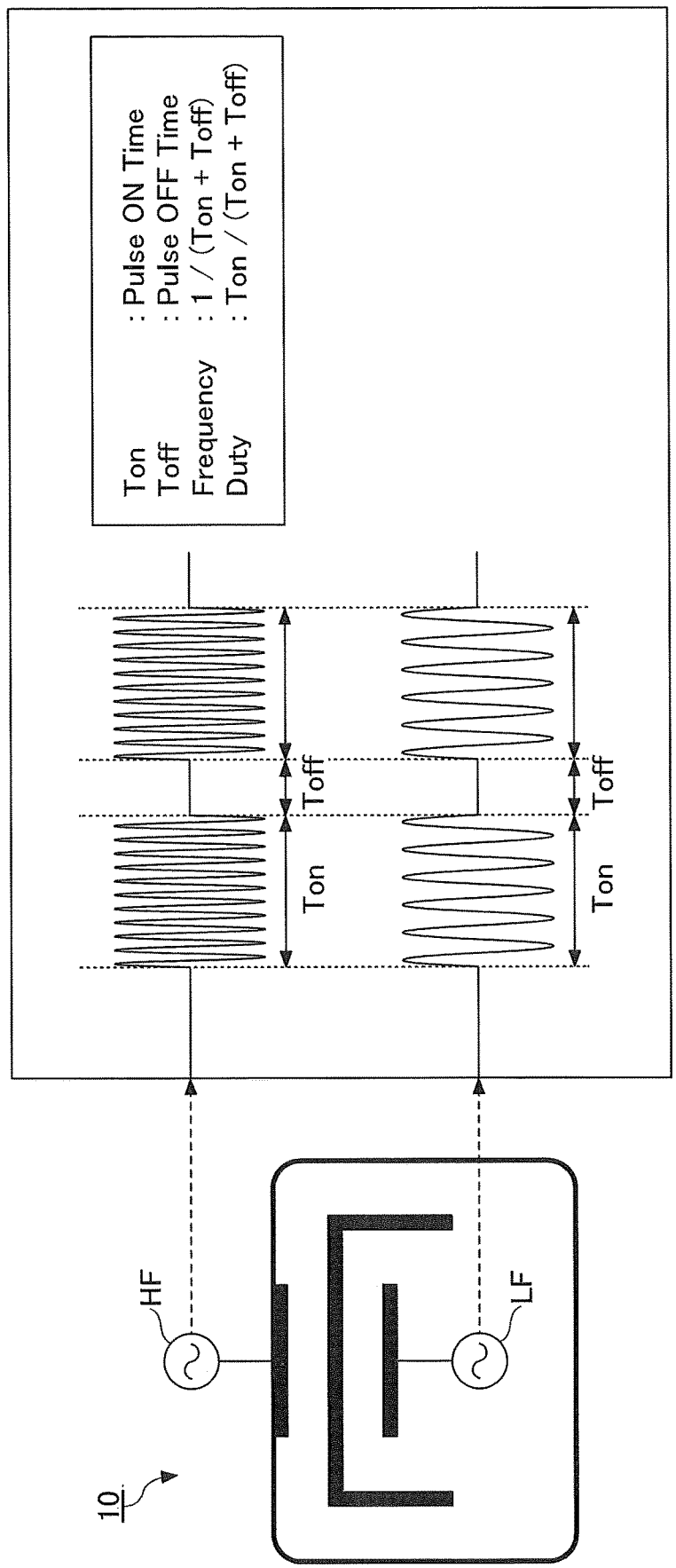
FIG. 2 is a diagram for explaining pulsed waves of RF pulse.

A brief description of the definition of a pulse wave of RF power is provided. FIG. 2 is a diagram for explaining pulsed waves of RF power. In a processing method according to the present embodiment described below, pulsed RF power is applied. That is, the first RF power (HF power) for plasma excitation and the second RF power (LF power) for drawing ions are all pulsed. Hereinafter, the pulsed wave of the first RF power may also be referred to as an "HF pulse". The pulsed wave of the second RF power may also be referred to as an "LF pulse". Pulsed waves of the first RF power and the second RF power may also be referred to as an "RF pulse" collectively.

As illustrated in FIG. 2, with regard to the HF pulse, a period when the HF pulse is on (hereinafter referred to as "on-period") is denoted by "Ton". A period when the HF pulse is off (hereinafter referred to as "off-period") is denoted by "Toff". During application of the HF power, a set of the on-period and the off-period is repeated periodically. A minimum unit in terms of on-period and off-period that is repeated periodically is referred to as a "cycle". In the case of FIG. 2, a period of time required for a cycle is "Ton+Toff". In other words, a frequency (Freq.) of the HF pulse (HF power) is 1/(Ton+Toff), and the HF pulse (HF power) is applied during the on-period (Ton) in a cycle.

With respect to the LF pulse, the on-period of the LF pulse is denoted by "Ton", and the off-period of the LF pulse is denoted by "Toff". In the case of FIG. 2, a frequency (Freq.) of the LF pulse is 1/(Ton+Toff), which is the same as the frequency of the HF pulse, and the LF power (LF pulse) is applied during the on-period (Ton) in a cycle.

The "duty cycle" is a ratio of the on-period Ton to the total time of the on-period Ton and the off-period Toff (Ton+Toff). That is, the duty cycle is expressed by Ton/(Ton+Toff).

FIG. 2 illustrates a case in which the on-period and the off-period of the HF pulse and the on-period and the off-period of the LF pulse are the same, for convenience to explain the definition of the pulsed wave. However, in the processing method according to the embodiment described below, the on-period and off-period of the HF pulse are not necessarily the same time as the on-period and off-period of the LF pulse, respectively. FIG. 2 also illustrates a case in which the HF power (HF pulse) and the LF power (LF pulse) are turned on simultaneously. However, in the processing method according to the embodiment described below, the LF pulse is turned on at a different time from when the HF pulse is turned on. The time difference between a start time of a cycle of the HF pulse and a start time of a cycle of the LF pulse (i.e., the time difference between the time when the HF pulse is turned on and the time when the LF pulse is turned on) may be referred to as a "phase difference". That is, in the processing method according to the embodiment, the HF pulse and the LF pulse have a given phase difference. Also, in the processing method according to the embodiment, the HF pulse is turned on once per cycle, and the LF pulse is turned on more than once per cycle.

[Application of RF Pulses in Comparative Examples]

A method of applying RF pulses according to comparative examples will be described with reference to FIG. 3. FIG. 3 is a diagram illustrating an example of the application of RF pulses according to comparative examples. The HF power for plasma excitation and the LF power for drawing ions that are applied in comparative examples 1 and 2 illustrated in the column (a) of FIG. 3 and the columns (b) of FIG. 3 are pulsed HF power (HF pulse) and pulsed LF power (LF pulse), respectively.

In the comparative example 1 of the column (a), both the frequency of the HF pulse and the frequency of the LF pulse are X (kHz), and the time of one cycle is 1/X (ms). In the comparative example 1, the duty cycle of both the HF pulse and the LF pulse are Y %.

In the comparative example 1 of the column (a), as illustrated in the row of "APPLICATION TIMING", the HF pulse is turned on at the same timing as when the LF pulse is turned on, and the length of the on-period of the HF pulse is the same as the length of the on-period of the LF pulse. Thus, the on-period of the HF pulse completely coincides with the on-period of the LF pulse. The HF pulse and the LF pulse are controlled to be turned on for a period of time corresponding to Y % of a cycle (i.e., 1/X (ms)). In the following description, the time when the HF pulse (or LF pulse) is turned on may be referred to as "on-timing" of the HF pulse (or LF pulse).

With respect to the comparative example 2 of the column (b), the comparative example 2 differs from the comparative example 1 in that the LF pulse has a given phase difference with respect to the HF pulse and that the duty cycle of the LF pulse is Z %. In the comparative example 2, the on-period of the HF pulse and the on-period of the LF pulse do not overlap. The LF pulse is turned on at a timing after a period of time corresponding to the given phase difference (Offset A %) has elapsed from the on-timing of the HF pulse.

The HF pulse is applied to the upper electrode showerhead 12. The HF pulse contributes to generation of a plasma, and controls plasma density. The LF pulse is applied to the lower electrode 111. The LF pulse controls ions in the generated plasma and draws ions into the substrate W. However, the HF pulse may be applied to the lower electrode 111 to contribute to generation of a plasma and to control plasma density.

As illustrated in the application timing of FIG. 3, in comparative example 1 in the column (a) of FIG. 3, because the on-periods of the HF pulse and the LF pulse overlap, higher harmonic standing waves are generated. This may cause hot spots on the substrate W, making it difficult to apply uniform plasma processing to the substrate.

In the comparative example 2 of the column (b), a plasma is generated from a gas by application of the HF pulse, and then ions are controlled by application of the LF pulse to draw the ions into the substrate W. Because the on-period of the HF pulse does not overlap with the on-period of the LF pulse, generation of hot spots on the substrate can be avoided, and uniform plasma processing can be applied to the substrate. In the comparative example 2 of the column (b), the on-timing of the LF pulse is controlled to be later than the on-timing of the HF pulse, so that the on-period of the HF pulse and the on-period of the LF pulse do not overlap, thereby improving ion energy distribution during plasma generation and controllability of incident angles of ions to the substrate.

However, in the comparative example 2 of the column (b), there may be a case in which the plasma is not ignited easily, and appropriate plasma density cannot be maintained during the on-period of the HF pulse. In this case, it is difficult to apply uniform plasma processing to the substrate W.

Accordingly, in the present embodiment, the LF pulse is turned on in accordance with the on-timing of the HF pulse such that the LF pulse is turned on immediately prior to application of the HF pulse. Accordingly, ignition of a plasma is promoted, the HF pulse and the LF pulse are applied while maintaining the plasma density, and ion energy distribution and incident angles of ions to the substrate can be controlled. Hereinafter, examples of application of the HF pulse and the LF pulse according to the embodiment will be described.

Examples 1 and 2

Figure 4:
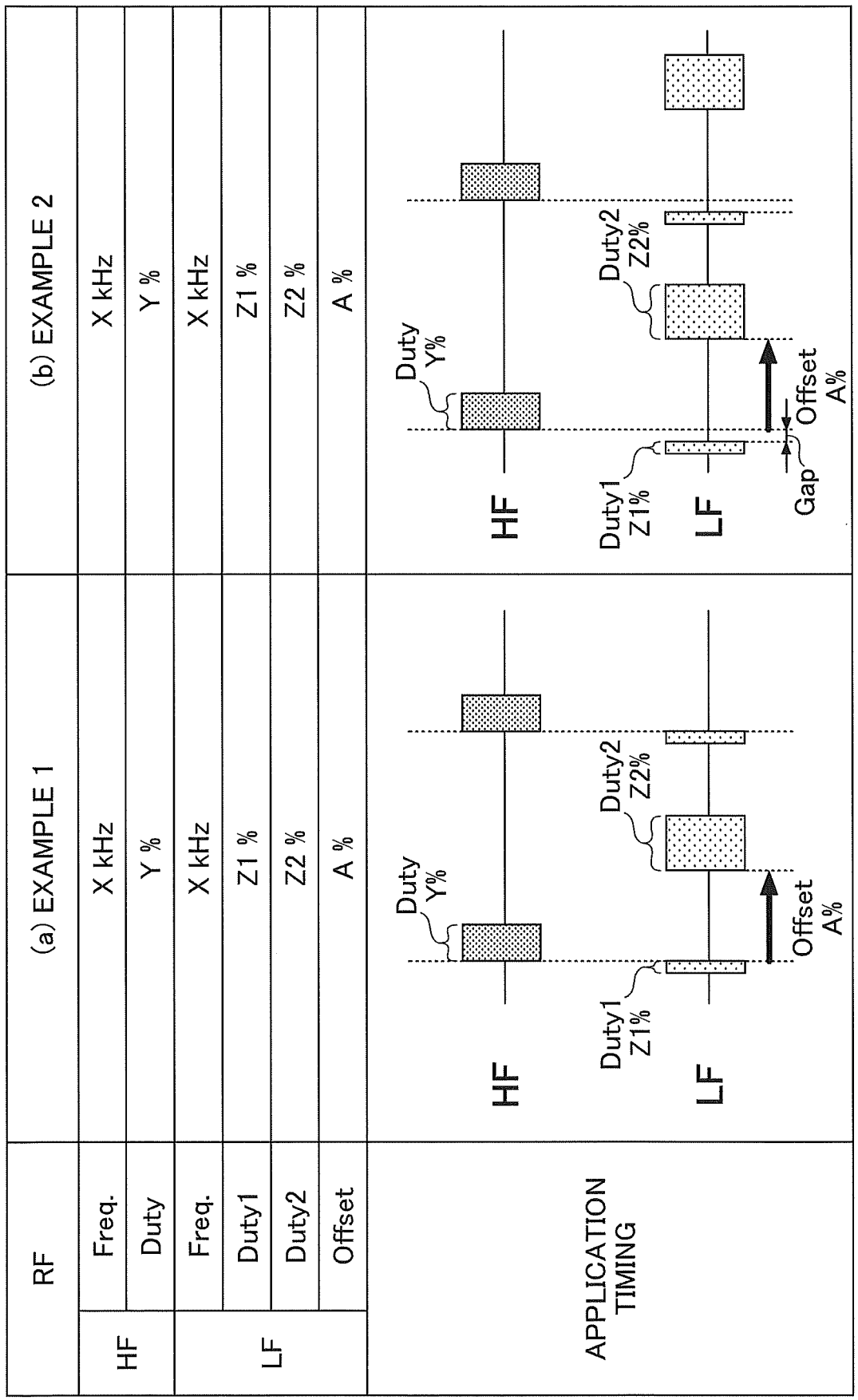
FIG. 4 is a diagram illustrating an example of application of RF pulses according to the embodiment.

Hereinafter, application of the HF pulse and the LF pulse according to the embodiment, and setting information (i.e., setting parameters) that is required for generating the HF pulse and the LF pulse according to the embodiment will be described with reference to FIG. 4. FIG. 4 is a diagram illustrating examples (i.e., Example 1 and Example 2) of application of the RF pulses according to the embodiment.

In column (a) of FIG. 4, an example of application of RF pulses according to Example 1 is illustrated. The column (a) also illustrates the setting parameters that are required for generating the HF pulse and the LF pulse in Example 1. The setting parameters are set to the controller 1b of the plasma processing apparatus 1a. In Example 1, the frequency of both the HF pulse and the LF pulse is X (kHz), and a period of time of one cycle is 1/X (ms). In Example 1, the HF pulse is turned on once in one cycle and the duty cycle (Duty) Y % of the on-period of the HF pulse is set. The LF pulse is turned on twice in one cycle. In other words, two on-periods of the LF pulse exist in one cycle of the LF pulse. One on-period (hereinafter referred to as "first on-period") of the two on-periods occurs immediately before the HF pulse, and the first on-period is set as one of the setting parameters. In the example of FIG. 4, the first on-period is set (defined) as a ratio (Z1%) of the duration of the first on-period to a period of time of a cycle, and this ratio may be referred to as a "duty cycle (Duty1)". The other on-period (hereinafter referred to as the "second on-period") occurs at a time after the HF pulse is turned off, and the second on-period is also set as one of the setting parameters. In the example of FIG. 4, the second on-period is also set (defined) as a ratio (Z2%) of the duration of the second on-period to a period of time of a cycle, and this ratio may be referred to as a "duty cycle (Duty2)". In addition, an offset time A % is set as one of the setting parameters, which indicates the on-timing of the LF pulse. As the offset time (A %), an elapsed time from the time when the HF pulse is turned on is used, and when a period of time corresponding to the offset time (A %) elapses after the HF pulse is turned on, the second on-period starts (i.e., LF pulse is turned on). As the HF pulse and the LF pulse are controlled such that the on-period of the HF pulse does not overlap with the on-period of the LF pulse, the period of time corresponding to the offset time (A %) is greater than the on-period of the HF pulse. Note that the offset time (A %) is expressed as a ratio of the elapsed time to a period of time of one cycle.

As illustrated in the row of "APPLICATION TIMING" in Example 1 of the column (a), the on-period of the HF pulse is controlled so as not to overlap with the first on-period and the second on-period of the LF pulse. The HF pulse is controlled to be turned on during a period of time corresponding to Y % of a period of a cycle (1/X (ms)), and the LF pulse is controlled to be turned on with a given phase difference with respect to the HF pulse. Also, the LF pulse is controlled to be turned on during a period corresponding to the duty cycle Z1% and during a period corresponding to the duty cycle Z2%, such that the on-periods of the LF pulse do not overlap with the on-period of the HF pulse. In addition, the first on-period of the LF pulse is controlled such that the first on-period of the LF pulse ends immediately prior to the time when the HF pulse is turned on. That is, the LF pulse is controlled to be turned off immediately before the time when the HF pulse is turned on. The second on-period of the LF pulse is controlled such that the second on-period of the LF pulse starts when time corresponding to the offset A % elapses after the time when the HF pulse is turned on.

As illustrated in the column (b) of FIG. 4, setting parameters in Example 2 are the same as those in Example 1. The difference between Example 1 and Example 2 is that the timing when the first on-period of the LF pulse ends coincides with the timing when the HF pulse is turned on in Example 1, while the timing when the first on-period of the LF pulse ends does not coincide with the timing when the HF pulse is turned on in Example 2. Example 2 differs from Example 1 in that the timing when the first on-period of the LF pulse ends is shifted earlier than the timing when the HF pulse is turned on, by the time corresponding to "Gap" illustrated in FIG. 4. The length of time of the "Gap" is within a range, inclusive of endpoints, between 0 µs and 200 µs.

As described above, Examples 1 and 2 control (set) a first timing to turn on the LF pulse (i.e., the time when the first on-period of the LF pulse is initiated; the timing is a negative timing relative to the on-timing of the HF pulse), the first on-period of the LF pulse, a second timing to turn on the LF pulse (i.e., the time when the second on-period of the LF pulse is initiated; the timing is a positive timing relative to the on-timing of the HF pulse), and the second on-period of the LF pulse. The duty cycle (Duty) Y % is an example of a first duty cycle representing a period while the first RF power is turned on. The offset time A % is an example of a given phase difference between the HF pulse and the LF pulse.

The LF pulse during the first on-period is used to ignite a plasma generated during the on-period of the HF pulse. That is, by setting the first on-period of the LF pulse, at a time location just before the on-timing of the HF pulse, the LF pulse is applied to the lower electrode 111 just before the timing when the HF pulse is turned on, the plasma can be ignited reliably, and density of the plasma generated during the on-period of the HF pulse can be maintained.

Meanwhile, the reason that the first on-period of the LF pulse is controlled so as not to overlap with the on-period of the HF pulse is as follows. The second matching circuit 32b performs monitoring during a period corresponding to approximately the last 10% of the on-period of the LF pulse, to adjust the impedance. This is to increase accuracy of impedance adjustment. Because reflected waves of the LF power are generated from the plasma side when the LF pulse rises, by adjusting impedance based on the monitoring during the period corresponding to approximately last 10% of the on-period of the LF pulse, in which almost no reflected wave is generated, accuracy of impedance adjustment increases.

If a portion of the last 10% of the on-period of the LF pulse, during which the impedance adjustment is performed, overlaps with the on-period of the HF pulse, the HF power influences the impedance adjustment although the impedance adjustment should preferably be performed based on only the LF power. As a result, the second matching circuit 32b cannot accurately adjust the impedance. Thus, the first on-period of the LF pulse is controlled to end immediately before the on-timing of the HF pulse. The timing when the first on-period of the LF pulse end is limited to time within the range, inclusive of endpoints, between 0 µs and 200 µs prior to the timing of turning on the HF pulse.

With respect to the second on-period of the LF pulse, by setting the second on-period of the LF pulse after the on-period of the HF pulse so that the second on-period of the LF pulse does not overlap with the on-period of the HF pulse, the LF pulse can be applied without overlapping with the HF pulse, and ion energy distribution and controllability of incident angles of ions to the substrate during plasma generation can be improved.

[Processing Method]

Figure 5:
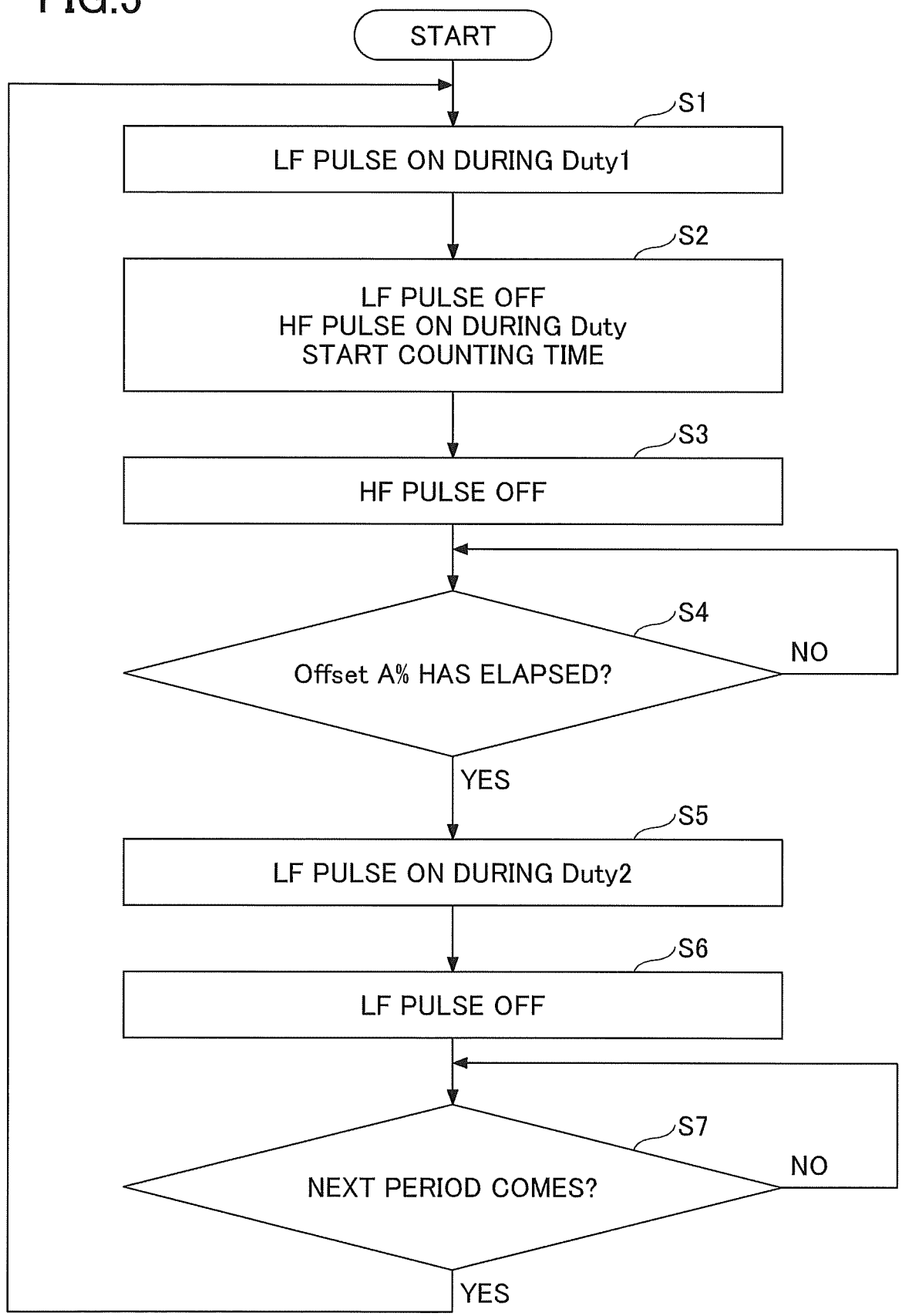
FIG. 5 is a flowchart illustrating an example of a processing method according to the embodiment.

The processing method according to the embodiment is executed after the above-described setting parameters are set to the controller 1b of the plasma processing apparatus 1a in advance. The processing method according to the present embodiment will be described with reference to FIG. 5. FIG. 5 is a flowchart illustrating an example of the processing method according to the present embodiment.

When the present process is started, the controller 1b of the plasma processing apparatus 1a determines the on-timing of the HF pulse. Next, when the time earlier than the on-timing of the HF pulse by a period of time corresponding to the duty cycle (Duty1) Z1% comes, the controller 1b of the plasma processing apparatus 1a turns on the LF pulse for the period of time corresponding to the duty cycle (Duty1) Z1% (step S1). By performing step 1, the first on-period of the LF pulse is controlled.

When the on-timing of the HF pulse comes, the controller 1b turns off the LF pulse, and turns on the HF pulse for a period of time corresponding to the duty cycle (Duty) Y % (step S2). When the controller 1b turns on the HF pulse in step S2, the controller 1b also starts counting the offset time (Offset).

When a period of time corresponding to the duty cycle (Duty) Y % elapses after the HF pulse is turned on, the controller 1b turns off the HF pulse (step S3). Next, in step S4, the controller 1b determines whether a period of time corresponding to the offset time A % has elapsed. When the offset time A % elapses, the controller 1b turns on the LF pulse for a period of time corresponding to the duty cycle (Duty2) Z2% (step S5). This controls the second on-period of the LF pulse. Next, in step S6, the controller 1b turns off the LF pulse.

Next, in step S7, the controller 1b determines whether the next cycle comes. In step S7, when the time earlier than the on-timing of the HF pulse by a period of time corresponding to the duty cycle (Duty1) Z1% comes, the controller 1b determines that the next cycle comes, the process returns to step S1, and the controller 1b turns on the LF pulse for the period of time corresponding to the duty cycle (Duty1) Z1% in step S1. By repeating steps S1-S7 every cycle, application of the HF pulse and the LF pulse can be controlled so that the HF pulse and the LF pulse do not overlap.

That is, by applying the LF pulse to the lower electrode 111 for the first on-period immediately before the time when the HF pulse is turned on, a plasma can be ignited reliably and density of the plasma generated during the on-period of the HF pulse just after the first on-period of the LF pulse can be maintained. Further, by controlling the first on-period of the LF pulse and the on-period of the HF pulse so as not to overlap with each other, accuracy of impedance adjustment can be improved. Further, in addition to the first on-period, by controlling the second on-period of the LF pulse so as not to overlap with the on-period of the HF pulse, ion energy distribution and controllability of incident angle of ions to the substrate can be improved.

[Alternative Setting Parameters]

Figure 6:
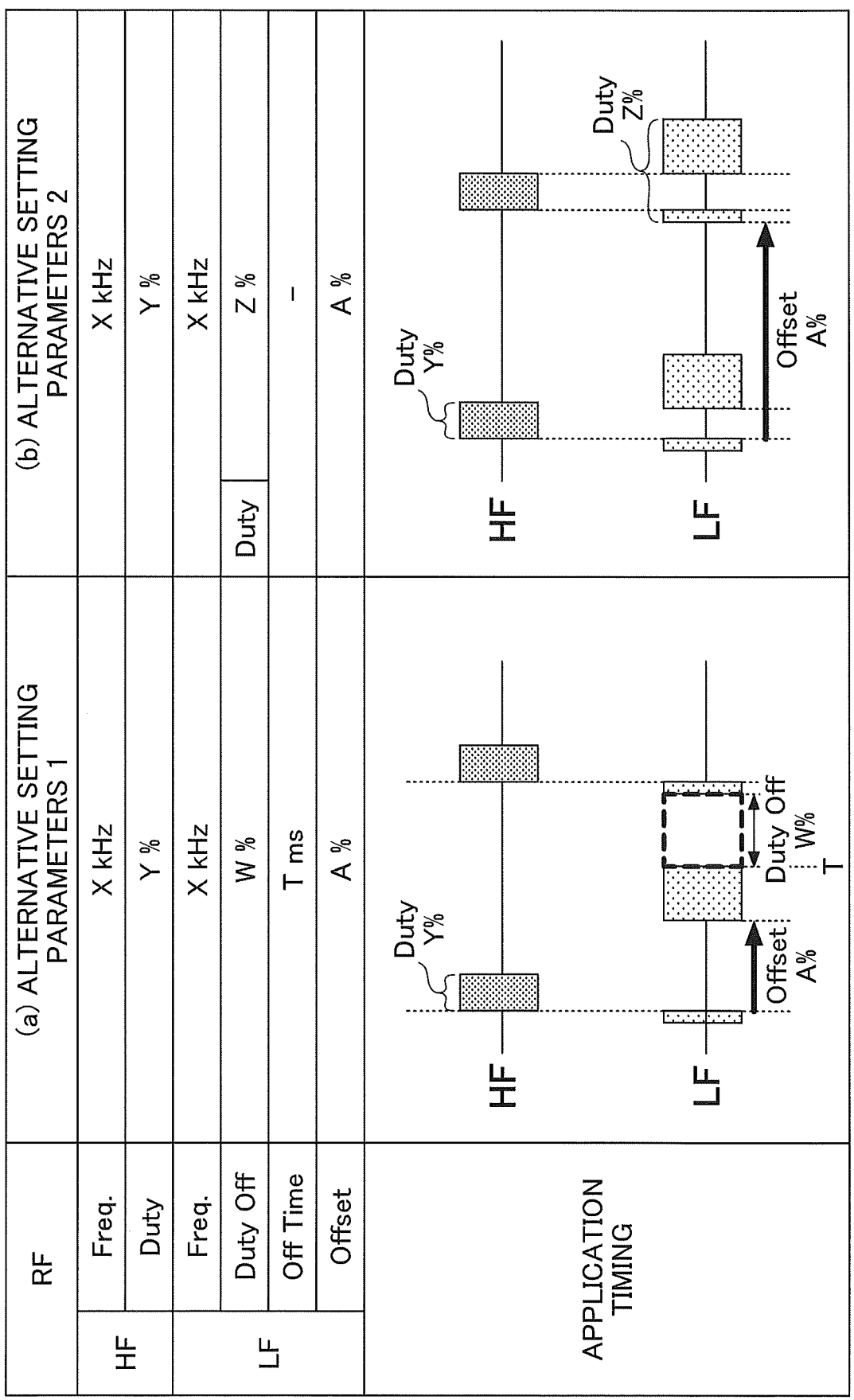
FIG. 6 is a diagram illustrating examples of alternative setting parameters for executing the processing method according to the embodiment.

Alternative setting parameters for executing the processing method according to the embodiment will be described with reference to FIG. 6. FIG. 6 is a diagram illustrating examples of alternative setting parameters for executing the processing method according to the embodiment.

In the alternative setting method 1 of the column (a) of FIG. 6, the duty cycle (Duty) Y %, which indicates the on-period of the HF pulse, is set as one of the setting parameters. Also, the offset time A %, which indicates the on-timing of the LF pulse, is set as one of the setting parameters. The offset time (A %) indicates an elapsed time from the time when the HF pulse is turned on, and when a period of time corresponding to the offset time (A %) elapses after when the HF pulse is turned on, the second on-period of the LF pulse starts (i.e., LF pulse is turned on).

As a setting parameter for controlling the first on-period and the second on-period of the LF pulse, which are located between the offset time A % and the start time of the next cycle, instead of setting the duty cycles (Duty1 and Duty2) representing the first on-period and the second on-period of the LF pulse respectively, parameters for determining a period during which the LF pulse should be turned off, between the offset time A % and the start time of the next cycle, are determined. The first parameter is referred to as an off-period (Duty Off) W % of the LF pulse, which indicates a length of time for which the LF pulse is turned off in a period of time between the offset time A % and the start time of the next cycle. The second parameter is referred to as a start timing T of the off-period W %, which indicates the time when the off-period W % is started (i.e., the time when the LF pulse is turned off).

According to these parameters, the off-period of the LF pulse that begins at the start timing T divides a period of time while the LF pulse is turned on into the first on-period and the second on-period, as indicated by the row of "APPLICATION TIMING". The timing for dividing a period of time while the LF pulse is turned on into the first on-period and the second on-period can be controlled by the start timing T of the off-period.

In the column (a) of FIG. 6, the frequency of both the HF and LF pulses is X (kHz). Duty Y % is the example of the first duty cycle representing a period while the first RF power is turned on. The offset time A % is an example of a given phase difference between the HF pulse and the LF pulse.

By setting the above parameters, control of the on-timing of the LF pulse is realized on the assumption that plasma ignition when the HF pulse is turned on is improved. Specifically, first, the controller 1b turns on the HF pulse with the duty cycle Y % (i.e., the controller 1b applies the HF power to the upper electrode showerhead 12 or the lower electrode 111 at the duty cycle Y %). Next, the controller 1b controls the start of the second on-period of the LF pulse by turning on the LF pulse after a period corresponding to the offset time A % has elapsed from the time when the HF pulse is turned on. Thereafter, the controller 1b controls the end of the second on-period of the LF pulse by turning off the LF pulse (LF power) at the start timing T of the off-period. Also, by turning off the LF pulse (i.e., stop applying the LF power) for the period of the off-period W % from the start timing T, and by then turning on the LF pulse (LF power) until the next HF pulse turns on, the controller 1b controls the first on-period of the LF pulse.

As described above, in the control using the alternative setting parameters 1, the off-period W % of the LF pulse, the start timing T of the off-period W %, and the offset time A % are set as setting parameters. Then, after turning on the LF pulse in accordance with the offset time A %, by controlling the off-timing of the LF pulse based on the off-period W % of the LF pulse and the start timing T of the off-period W %, the first on-period and the second on-period can be controlled.

Because the alternative setting method 1 is a method in which setting parameters of the off-timing are added to a set of the setting parameters for the standard method according to Example 1 or 2 illustrated in FIG. 4, the techniques according to Examples 1 and 2 can be utilized in the alternative setting method 1. However, the alternative setting method 1 is performed based on the assumption that the LF pulse is turned on from the time specified by the offset time A % to the time when the HF pulse is turned on in the next cycle.

Alternative setting method 2 of the column (b) in FIG. 6 sets the duty cycle Y %, which indicates the on-period of the HF pulse, and the duty cycle Z %, which includes the first on-period and the second on-period of the LF pulse. In other words, as illustrated in the row of "APPLICATION TIMING" in the column (b) of FIG. 6, the duty cycle Z % indicates a period from the start time of the first on-period to the end time of the second on-period. Also, the offset time A %, which indicates a period of time from the on-timing of the HF pulse to the on-timing of the LF pulse, is set.

The frequency of both the HF and LF pulses is X (kHz). Duty Y % is the example of the first duty cycle representing a period while the first RF power is turned on. The offset time A % is an example of a given phase difference between the HF pulse and the LF pulse.

In the alternative setting method 2, control is performed to turn off the LF pulse while the HF pulse is turned on. Therefore, it is not necessary to set the off-period W % of the LF pulse and the start timing T that are set in the alternative setting method 1. However, in the alternative setting method 2, the duty cycle Z % is assumed to be started from the on-timing of the LF pulse after the offset time A %.

By setting the above parameters, control of the on-timing of the LF pulse is realized on the assumption that plasma ignition when the HF pulse is turned on is improved. Specifically, first, the controller 1b turns on the HF pulse with the duty cycle Y % (i.e., the controller 1b applies the HF power to the upper electrode showerhead 12 or the lower electrode 111 at the duty cycle Y %). Next, the controller 1b controls start of the first on-period of the LF pulse by turning on the LF pulse after a period corresponding to the offset time A % has elapsed from the time when the HF pulse is turned on. Thereafter, during the on-period of the HF pulse, the controller 1b turns off the LF pulse, and turns on the LF pulse at the off-timing of the HF pulse, to control the second on-period.

As described above, in the control by the alternative setting method 2, because the number of the setting parameters can be reduced as compared to Example 1, Example 2, and the alternative setting method 1, the control can be performed more easily. Also, in a case in which the duty cycle of the HF pulse is adjusted gradually (Duty Ramp), overlapping of the HF pulse and the LF pulse is prevented.

As described above, in the processing method and the plasma processing apparatus according to the present embodiment, pulsed waves of RF power can be applied while maintaining appropriate plasma density.

The processing method and the plasma processing apparatus according to the present embodiment disclosed herein are to be considered exemplary in all respects and not restrictive. The above-described embodiment and the above-described alternative methods may be modified and enhanced in various forms without departing from the scope of the appended claims. Matters described in the above-described embodiment and the above-described alternative methods may take other configurations to an extent not inconsistent, and may be combined to an extent not inconsistent.

For example, in the above-described embodiment, the LF pulse is controlled by defining the first on-period of the LF pulse and the second on-period of the LF pulse in one cycle, but this is not limited thereto. In addition to the first on-period of Duty1 and the second on-period of Duty2 in Examples 1 and 2, a third on-period of Duty3 may be defined, or other on-periods of the LF pulse may be defined. In this case, after the second on-period of Duty2 illustrated in FIG. 4, there may be the third on-period of Duty3 or other on-periods.

The plasma processing apparatus of the present disclosure is applicable to any type of plasma processing apparatuses, such as an apparatus for an atomic layer deposition (ALD), a capacity coupled plasma (CCP) type apparatus, an inductively coupled plasma (ICP) type apparatus, a radial line slot antenna (RLSA) type apparatus, an electron cyclotron resonance plasma (ECR) type apparatus, and a helicon wave plasma (HWP) type apparatus.

In addition, the plasma processing apparatus may be an apparatus for applying a predetermined process (for example, a film forming process, an etching process, etc.) to the substrate, and is not limited to an apparatus for a specific purpose.

What is claimed is:

1. A method performed by a plasma processing apparatus including a first electrode and a second electrode, the method comprising:
    applying a pulsed wave of first radio frequency (RF) power to the first electrode or the second electrode; and
    applying a pulsed wave of second RF power to the first electrode, with a given phase difference relative to the pulsed wave of the first RF power, the second RF power having a lower frequency than the first RF power;
    wherein the applying of the pulsed wave of the second RF power includes
        controlling a first on-period of the second RF power during which the second RF power is turned on and a second on-period of the second RF power during which the second RF power is turned on, such that the first on-period and the second on-period do not overlap with a period of time while the first RF power is turned on, the first on-period being different from the second on-period; and
    controlling the first on-period such that the first on-period ends just before the first RF power is turned on.

2. The method according to claim 1, wherein a timing when the first on-period ends is within a range between 0 seconds and 200 microseconds prior to a time when the first RF power is turned on.

3. The method according to claim 1, further comprising setting a first duty cycle that controls the period of time during which the first RF power is turned on, the given phase difference, an off-period that divides a period of time while the second RF power is turned on into the first on-period and the second on-period, and a start timing indicating a time when the off-period starts; wherein
the applying of the pulsed wave of the first RF power includes applying the pulsed wave of the first RF power with the first duty cycle;
the controlling of the second on-period includes
    controlling a start time of the second on-period of the second RF power based on the given phase difference, and
    turning off the second RF power for a period corresponding to the off-period, from a time indicated by the start timing; and
the controlling of the first on-period includes
    turning on the second RF power after the period corresponding to the off-period has elapsed.

4. The method according to claim 1, further comprising setting a first duty cycle that controls the period of time during which the first RF power is turned on, and the given phase difference; wherein
the applying of the pulsed wave of the first RF power includes applying the pulsed wave of the first RF power with the first duty cycle;
the controlling of the first on-period includes
    controlling a start time of the first on-period of the second RF power based on the given phase difference, and
    turning off the second RF power at a time when the first RF power is turned on; and
the controlling of the second on-period includes
    turning on the second RF power at a time when the first RF power is turned off.

5. The method according to claim 1, wherein the second RF power applied during the first on-period is used to ignite a plasma generated during the period of time while the first RF power is turned on.

\* \* \* \* \*